(12) United States Patent
Mills

(10) Patent No.: US 10,461,239 B2
(45) Date of Patent: Oct. 29, 2019

(54) MICROSCALE SENSOR STRUCTURE WITH BACKSIDE CONTACTS AND PACKAGING OF THE SAME

(71) Applicant: Interdisciplinary Consulting Corp., Gainesville, FL (US)

(72) Inventor: David Alan Mills, Gainesville, FL (US)

(73) Assignee: INTERDISCIPLINARY CONSULTING CORP., Gainesville, FL (US)

( * ) Notice: Subject to any disclaimer, the term of this patent is extended or adjusted under 35 U.S.C. 154(b) by 59 days.

(21) Appl. No.: 15/830,348

(22) Filed: Dec. 4, 2017

(65) Prior Publication Data

US 2018/0159017 A1    Jun. 7, 2018

Related U.S. Application Data

(60) Provisional application No. 62/430,879, filed on Dec. 6, 2016, provisional application No. 62/443,701, filed on Jan. 7, 2017.

(51) Int. Cl.
*G01P 15/08* (2006.01)
*H01L 41/047* (2006.01)
(Continued)

(52) U.S. Cl.
CPC ........ *H01L 41/0475* (2013.01); *G01L 9/0005* (2013.01); *G01L 19/0069* (2013.01);
(Continued)

(58) Field of Classification Search
CPC ............. H01L 41/0475; H01L 41/0533; H01L 41/1132; H01L 41/187; H01L 41/314; H01L 41/332; H01L 23/13; H01L 24/48; H01L 24/45; H01L 24/85; H01L 2224/05624; H01L 2224/05644; H01L 2224/45124; H01L 2224/45139; H01L 2224/45144; H01L 2224/45147; H01L 2224/48091; H01L 2224/48106; H01L 2224/48227; H01L 2224/4824; H01L 2224/48465; H01L 2224/49175;
(Continued)

(56) References Cited

U.S. PATENT DOCUMENTS

2009/0218668 A1 * 9/2009 Zhe .................... B81C 1/00301
                                                                257/680
2014/0312478 A1 * 10/2014 Lin .................... H01L 23/4952
                                                                257/667
(Continued)

*Primary Examiner* — Calvin Y Choi
(74) *Attorney, Agent, or Firm* — Talem IP Law, LLP

(57) ABSTRACT

A microscale sensor structure is provided that enables backside electrical connection to flush-mounted microscale sensors without through-wafer-vias (TWVs). A flush-mounted microscale sensor can be fabricated without TWVs by providing a sensor support substrate with openings for electrical connection access to the backside of a device layer. Backside electrical connection is made to the sensing element(s) of the device layer through the openings in the support substrate. Electrical isolation of the sensing element(s) from the support substrate is accomplished through use of an insulating support substrate and/or an insulating layer between the support substrate and the device layer.

19 Claims, 17 Drawing Sheets

(51) Int. Cl.
*H01L 41/053* (2006.01)
*H01L 41/113* (2006.01)
*H01L 23/00* (2006.01)
*H01L 23/13* (2006.01)
*G01L 9/00* (2006.01)
*G01L 19/00* (2006.01)
G01L 9/08 (2006.01)
H01L 41/332 (2013.01)
H01L 41/187 (2006.01)
H01L 41/314 (2013.01)
G01L 9/12 (2006.01)

(52) U.S. Cl.
CPC .............. *H01L 23/13* (2013.01); *H01L 24/48* (2013.01); *H01L 41/0533* (2013.01); *H01L 41/1132* (2013.01); *G01L 9/08* (2013.01); *G01L 9/12* (2013.01); *H01L 24/45* (2013.01); *H01L 24/85* (2013.01); *H01L 41/187* (2013.01); *H01L 41/314* (2013.01); *H01L 41/332* (2013.01); *H01L 2224/05624* (2013.01); *H01L 2224/05644* (2013.01); *H01L 2224/45124* (2013.01); *H01L 2224/45139* (2013.01); *H01L 2224/45144* (2013.01); *H01L 2224/45147* (2013.01); *H01L 2224/4824* (2013.01); *H01L 2224/48091* (2013.01); *H01L 2224/48106* (2013.01); *H01L 2224/48227* (2013.01); *H01L 2224/48465* (2013.01); *H01L 2224/49175* (2013.01); *H01L 2224/73215* (2013.01); *H01L 2924/35* (2013.01)

(58) Field of Classification Search
CPC ....... H01L 2224/73215; H01L 2924/35; G01L 9/08; G01L 9/12
See application file for complete search history.

(56) References Cited

U.S. PATENT DOCUMENTS

2016/0141219 A1\* 5/2016 Liu .................. G01L 19/14 257/737
2016/0221824 A1\* 8/2016 Alper ................ B81C 1/00301
2016/0320255 A1\* 11/2016 Chiou ............... G01L 9/0042

\* cited by examiner

MICROSCALE SENSOR STRUCTURE WITH BACKSIDE CONTACTS AND PACKAGING OF THE SAME

CROSS-REFERENCE TO RELATED APPLICATION

The present invention claims the benefit of U.S. Provisional Application Ser. No. 62/430,879, filed on Dec. 6, 2016, and U.S. Provisional Application Ser. No. 62/443,701, filed on Jan. 7, 2017, which are hereby incorporated by reference in their entirety, including any figures, tables, and drawings.

BACKGROUND

The measurement of surface pressure and wall shear stress (skin friction) in laminar, transitional, and turbulent boundary layers requires that the sensing element be exposed to the flow. As such, it is necessary to minimize the surface roughness of the sensor to minimize disturbances to the surrounding flow field and provide increased measurement accuracy.

Electrical connection to conditioning electronics for microscale sensors typically occurs via wire bonds or bump bonding. Traditional wire bonds placed on the front side of pressure and wall shear stress sensors cause flow disturbances due to wire bond loop heights in excess of 100 μm, resulting in measurement errors and an increase in overall drag. Bump bonding can circumvent this flow disturbance by using electrical through-wafer vias (TWVs) that allow connection of the sensor to the conditioning electronics; however, the rigid connection of the sensor through the bump bonds can cause large packaging stresses that result in increased measurement error. Additionally, bump bonding and TWVs can lead to increased fabrication complexity and cost due to a larger number of processing steps and challenges associated with integration of the sensor fabrication process.

Despite years of effort, the ability to make continuous, real-time, direct measurements of wall shear stress with both mean and fluctuating components remains elusive. Because of this, investigations into fundamental fluid flow problems are often hindered. An instrumentation-grade tool to precisely measure wall shear stress would enable further research in the areas of skin friction drag and turbulent boundary layer analysis.

BRIEF SUMMARY

Microscale sensor structures with backside contacts and packaging of the same are described. A flush-mounted microscale sensor can be fabricated without TWVs by providing a sensor support substrate with openings for electrical connection access to the backside of a device layer. Backside electrical connection is made to the sensing element(s) of the device layer through the openings in the support substrate. Electrical isolation of the sensing element(s) from the support substrate is accomplished through use of an insulating support substrate and/or an insulating layer between the support substrate and the device layer.

The packaging of the sensor structure can include a circuit board on which the support substrate is attached. The circuit board can have one or more openings that expose the openings in the support substrate such that a bond wire can electrically connect contacts on the circuit board to a conductive surface on the backside of the device layer. With all the connections at the backside of the device layer, the exposed, front side of the device layer can minimize disturbances of fluid flow caused by surface roughness.

BRIEF DESCRIPTION OF THE DRAWINGS

FIG. 10A is an image of the SWLI measurements and FIG. 10B is a plot of the associated X and Y profiles of the SWLI measurements.

FIG. 11A is an image of the SWLI measurements and FIG. 11B is a plot of the associated X and Y profiles of the SWLI measurements.

DETAILED DESCRIPTION

Microscale sensor structures with backside contacts and packaging of the same are described. A flush-mounted microscale sensor can be fabricated without TWVs by providing a sensor support substrate with openings for electrical connection access to the backside of a device layer. A circuit board (CB) on which the microscale sensor is bonded can have one or more openings, exposing the openings in the sensor support substrate. With all the connections at the backside of the device layer, the exposed, front side of the device layer can minimize disturbances of fluid flow caused by surface roughness.

Direct wall shear stress measurement is typically accomplished via a force balance in which a movable floating element deflects due to an integrated shear force. For an open loop system, this floating element is attached to a compliant structure which resists the deflection and provides a restorative force for returning the floating element to its nominal position. For accurate measurement of fluid-wall interactions in a turbulent flow field, the installed sensor should be non-invasive, or hydraulically smooth, so as not to corrupt the flow measurement.

Advantageously, the packaging and sensor design minimize protrusions on the front surface of the sensor, which thereby reduces sensor-induced drag (such as caused by inserting the sensor into a tunnel wall) as well as surface roughness and its corresponding measurement errors.

Figure 1:
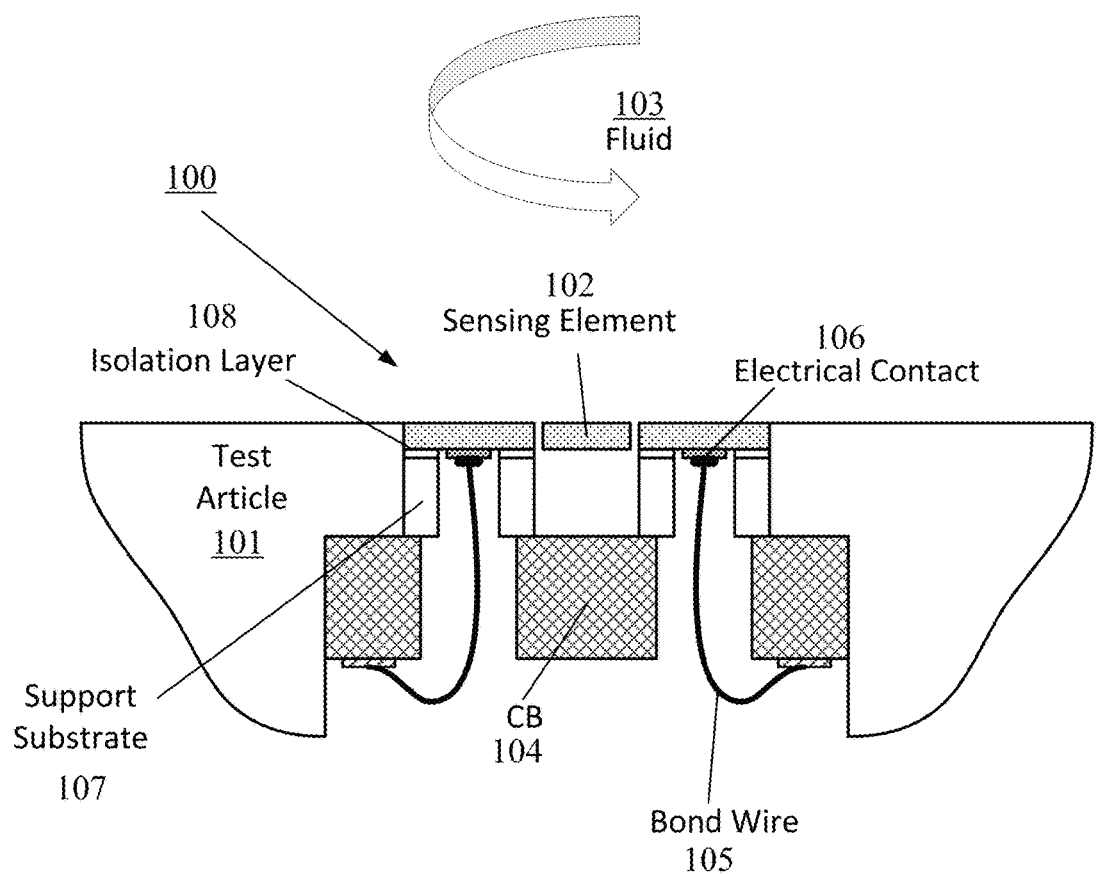
FIG. 1 shows a cross-section of a wall shear stress sensor illustrating the electrical connections made through the backside of the device.

The sensor structure and fabrication described herein provide a process for the creation of flush-mounted microscale sensors without TWVs by creating pockets in the sensor support substrate. The associated method for packaging the sensor by bonding to a circuit board, such as a printed circuit board (PCB) or an electrical interposer, allows electrical connection via wire bonding to the backside of the sensing element. One such potential configuration for a wall shear stress sensor is shown in FIG. 1. FIG. 1 shows a cross-section of a wall shear stress sensor illustrating the electrical connections made through the backside of the device.

Referring to FIG. 1, a microscale sensor 100 can be flush mounted as part of a test article 101 such that a sensing element 102 of the microscale sensor 100 is exposed to a fluid 103 (e.g., gas, liquid). Instead of TWVs, the microscale sensor 100 has backside electrical connection to a circuit board 104 via a bond wire 105 attached to an electrical contact 106 (or other conductive layer or surface) on the backside surface of a device layer (in which the sensing element 102 is formed) through contact openings in a support substrate 107.

The circuit board 104 can be, for example, a printed circuit board or an interposer.

The bond wire 105 may be formed, for example, of gold, aluminum, silver, copper, or a combination thereof.

The electrical contact 106 may be formed, for example, of aluminum, gold, or other wire bondable material (e.g., Al-2% Si).

Figure 3A:
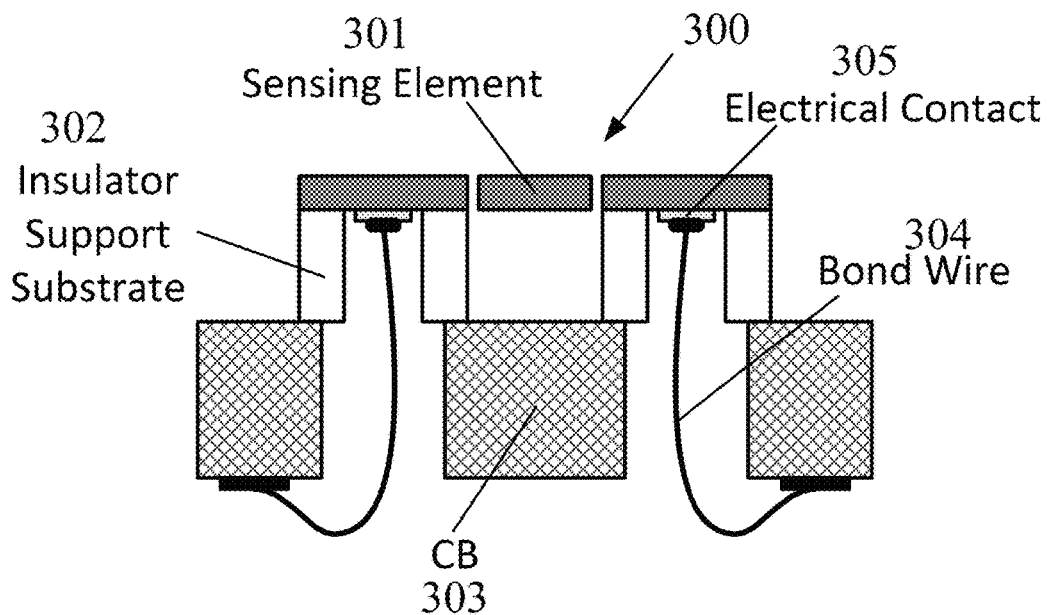
FIG. 3A shows a cross-section of a microscale sensor with electrical isolation provided by the use of an insulating support substrate.

The support substrate 107 can be an insulating substrate (see e.g., FIG. 3A). Examples of insulating substrates that may be used as the support substrate 107 include, but are not limited to, glass and sapphire. In some cases, especially when the support substrate 107 is not an insulating substrate, an isolation layer 108 is provided between the device layer (in which the sensing element 102 is formed) and the support substrate 107 to provide electrical isolation of the sensing element(s).

The isolation layer 108 can be formed, for example, of silicon dioxide, silicon nitride, other insulative material, or a combination thereof. In some cases, the isolation layer 108 is formed from a portion of a silicon-on-insulator (SOI) wafer used to form the sensing element 102, for example, an insulator portion of the SOI wafer. In some cases, the insulation layer 108 may be formed from a silicon-on-sapphire (SOS) wafer. In some cases, for example, in which an SOI or SOS wafer is used to fabricate the sensing element 102, the silicon or sapphire bottom layer can be used as the support substrate 107. Depending on the materials used for the support substrate, the contact openings may be created through one or more micromachining processes, for example, chemical etching, plasma etching, mechanical drilling, or laser drilling.

Figure 2:
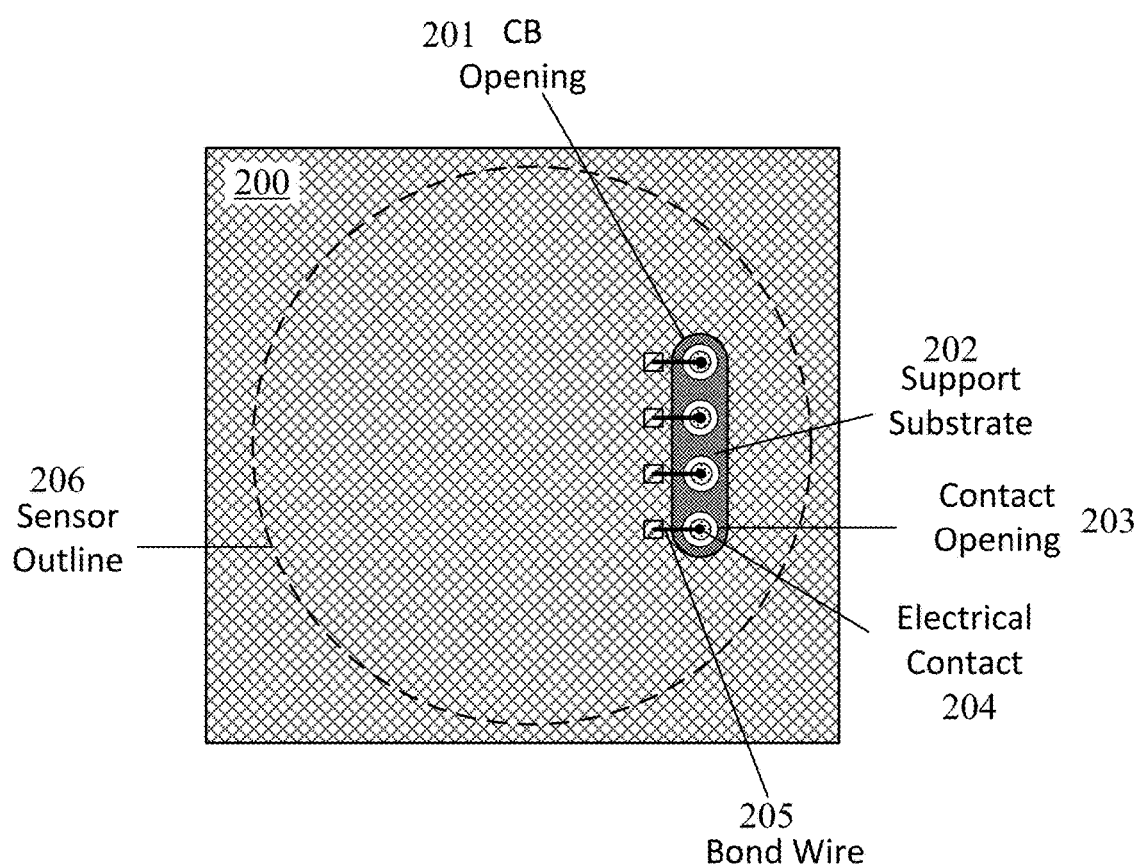
FIG. 2 shows a backside view of an assembled microscale sensor and circuit board.

FIG. 2 shows a backside view of an assembled microscale sensor and circuit board. Referring to FIG. 2, a back side of a circuit board 200 is shown. The circuit board 200 can have one or more openings 201 that expose a support substrate 202 of a microscale sensor. In the example shown in FIG. 2, a single, elongated slot is provided that exposes all the contact openings 203 of the support substrate 202; however, the circuit board 200 may instead have multiple openings corresponding to one, two, or more of the contact openings 203 in the support substrate 202 (e.g., such as shown by the two openings in the CB 104 of FIG. 1). The contact openings 203 expose electrical contacts 204 of the backside of the device layer. An electrical contact 204 may be configured, for example, as electrical contact 106 such as described with respect to FIG. 1. Electrical connection can be established between the backside of the sensing element (e.g., via the electrical contact 204) and the circuit board 200 by a bond wire 205 that passes through the opening 201 of the circuit board and the contact opening 203 of the support substrate 202. Although four contact openings 203 are shown, the actual number of openings are based on the sensor circuit design (and its corresponding input, output, power, and ground signal specifications).

The microscale sensor structure with support substrate 202 and device layer (which would be exposed by contact opening 203) may be attached to the front side of the circuit board 200, for example, within the sensor outline 206 using, for example, liquid epoxy or adhesive films.

Figure 7:
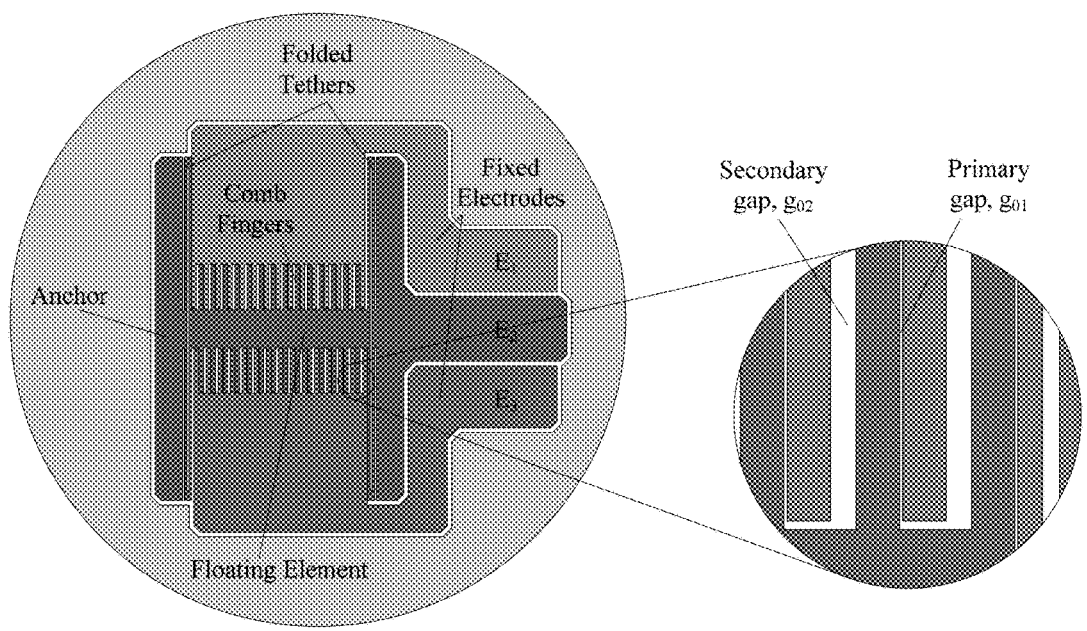
FIG. 7 shows an example front view of a differential capacitive wall shear stress sensor that can be packaged as illustrated in FIGS. 1 and 2.

One example of a front of a sensor structure is shown in FIG. 7, which shows an example front view of a differential capacitive wall shear stress sensor that can be packaged as illustrated in FIGS. 1 and 2.

As previously mentioned, the electrically conductive sensing element is configured to remain electrically isolated from the support substrate either via an isolation layer (e.g., silicon dioxide) or by the use of an insulating (non-conductive) material as the support substrate (e.g., glass, sapphire).

FIG. 3A shows a cross-section of a microscale sensor with electrical isolation provided by the use of an insulating support substrate. As illustrated in FIG. 3A, a microscale sensor 300 can include a sensing element 301 formed in a device layer on an insulator support substrate 302. The insulator support substrate 302 can be bonded to a circuit board 303 and electrical connections can be made to the backside of the device layer via bond wire 304 passing through contact openings of the insulator support substrate 302 to an electrical contact 305 (or conductive region) of the device layer.

Figure 3B:
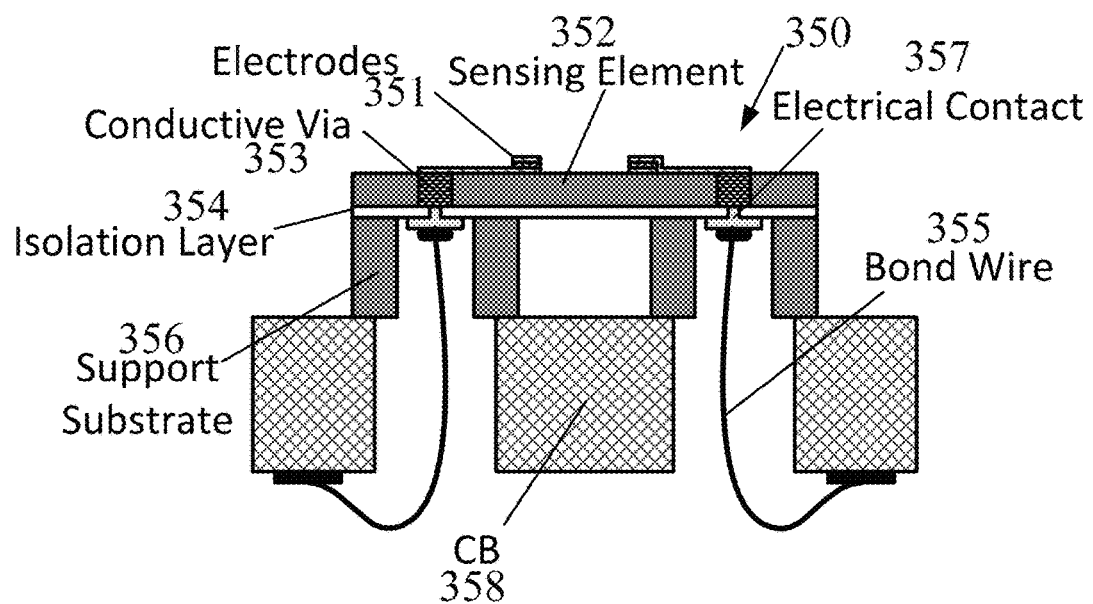
FIG. 3B shows a cross-section of a microscale sensor with another sensing element configuration and electrical isolation provided by an insulating layer.

FIG. 3B shows a cross-section of a microscale sensor with another sensing element configuration and electrical isolation provided by an insulating layer. Referring to FIG. 3B, in this example of a microscale sensor 350, sensor electrodes 351 are fabricated on top of a mechanical sensing element 352, which may be either electrically conductive or insulating. In this embodiment, conductive vias 353 (either solid or hollow) are created in the layer with the sensing element 352 and openings are created in an isolation layer 354 to allow connection from the front side electrodes 351 to the backside bond wires 355 that pass through the support substrate 356 and connect from an electrical contact 357 at the backside of the sensing element to the circuit board 358.

Advantageously, the above described approaches are able to achieve a smooth top surface (at least smoother than when connections are attached to the front of the sensor) by making the electrical connections from the backside of the die. This is especially important for surface measurements such as pressure and skin friction in a flow environment where the sensing element must be exposed to the flow field. In addition, the elimination of TWVs provides reduced fabrication costs and potentially relaxes the fabrication constraints and challenges with process flow integration typically associated with TWVs.

Figure 4A:
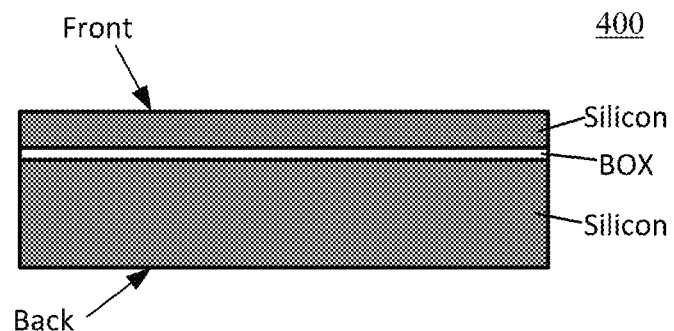
FIGS. 4A-4F illustrate a process flow for fabrication of a capacitive shear stress sensor with backside electrical contacts according to an example implementation.
Figure 4B:
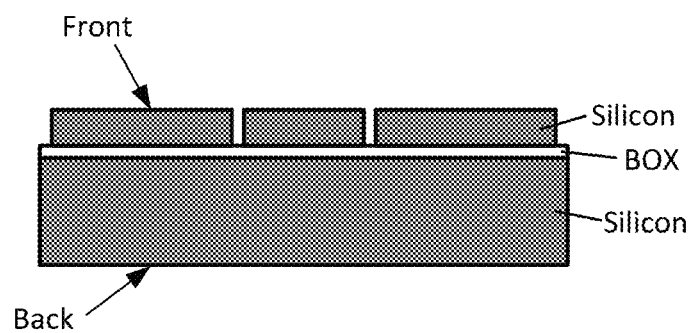

FIGS. 4A-4F illustrate a process flow for fabrication of a capacitive shear stress sensor with backside electrical contacts according to an example implementation. Referring to FIG. 4A, a process flow can begin with a silicon-oninsulator (SOI) wafer 400. The sensing element layer can be patterned via photolithography and a bulk micromachining etch process on a front side of the wafer 400, resulting in a patterned front side, such as shown in FIG. 4B. The etching process may involve, for example, deep reactive-ion etching (DRIE), wet chemical etching, plasma etching, or laser machining.

Figure 4C:
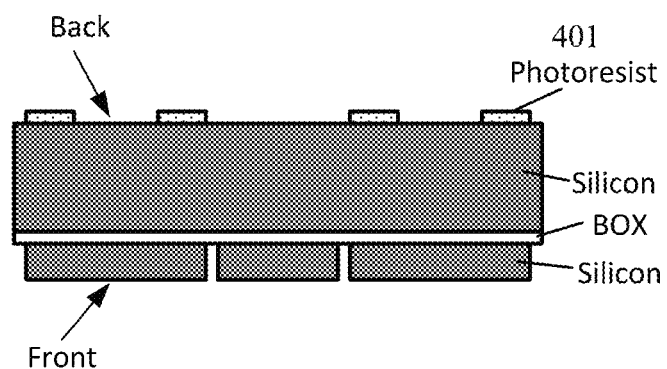
Figure 4D:
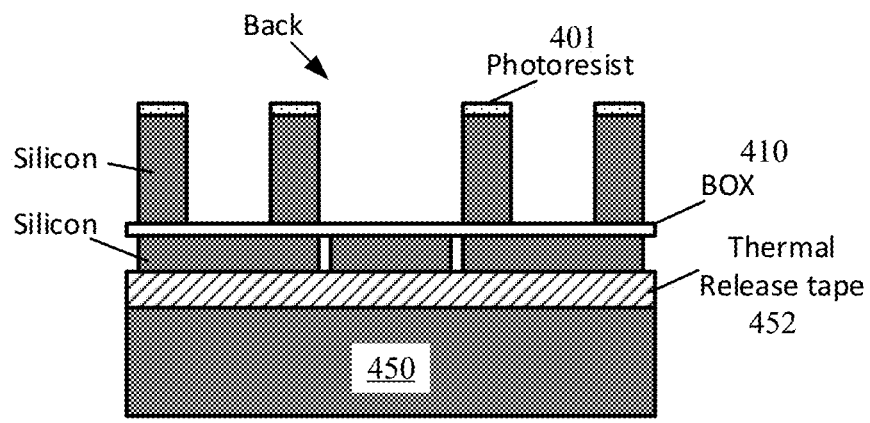

Photolithography can also be used to define the backside openings. For example, as shown in FIG. 4C, photoresist 401 can be deposited and patterned on the backside of wafer 400. Referring to FIG. 4D, the wafer 400 can be placed on a silicon carrier 450 with thermal release tape 452 and etched through the backside using a bulk micromachining process (e.g., DRIE, wet chemical etching, plasma etching, or laser machining) until the insulating (buried oxide (BOX)) layer 410 of the wafer 400 is exposed.

Figure 4E:
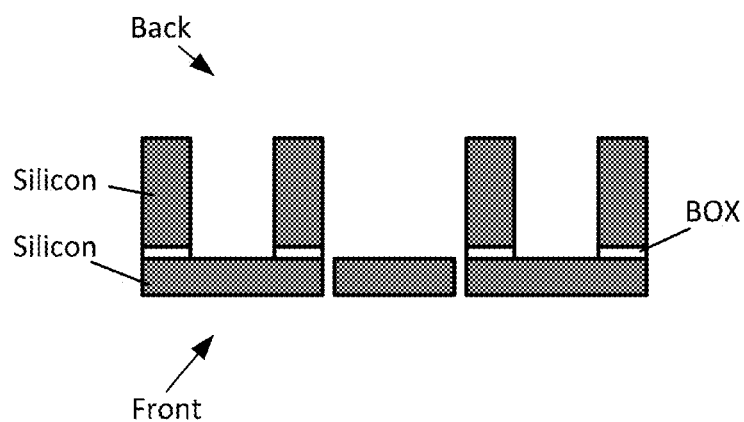
Figure 4F:
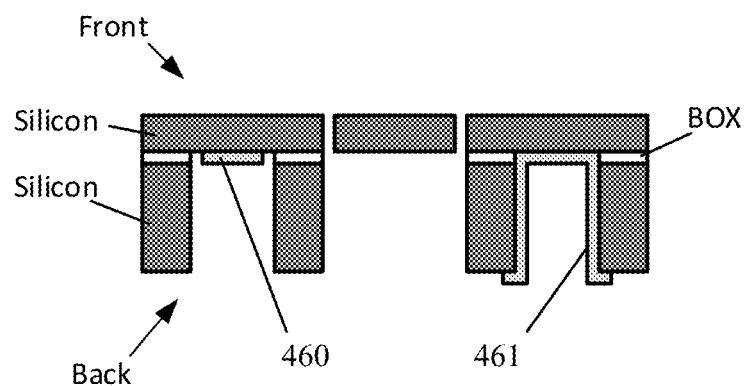

Then, the wafer 400 can be released from the carrier 450, the photoresist 401 is removed, and the BOX layer 410 is etched, as shown in FIG. 4E. As shown in FIG. 4F, wire bondable metal 460, 461 can be deposited into the contact openings for wire bonding. The wire bondable metal 460, 461 can be, for example, metal aluminum-2% silicon (Al-2% Si), aluminum, gold, another wire bondable metal, or a combination thereof. In some cases, a shadow mask can be used to deposit the wire bondable metal 460, 461 via sputtering, evaporation, or other deposition processes After bonding the backside of the fabricated wafer to a circuit board (not shown), wire bonds can be formed. In some cases, instead of applying a wire bond, a conductive adhesive may be used to provide the backside electrical connection.

In some cases, the device layer can include piezoelectric material, which is suitable for pressure and acoustic sensing. The piezoelectric material can be, for example, aluminum nitride (AlN).

Figure 5A:
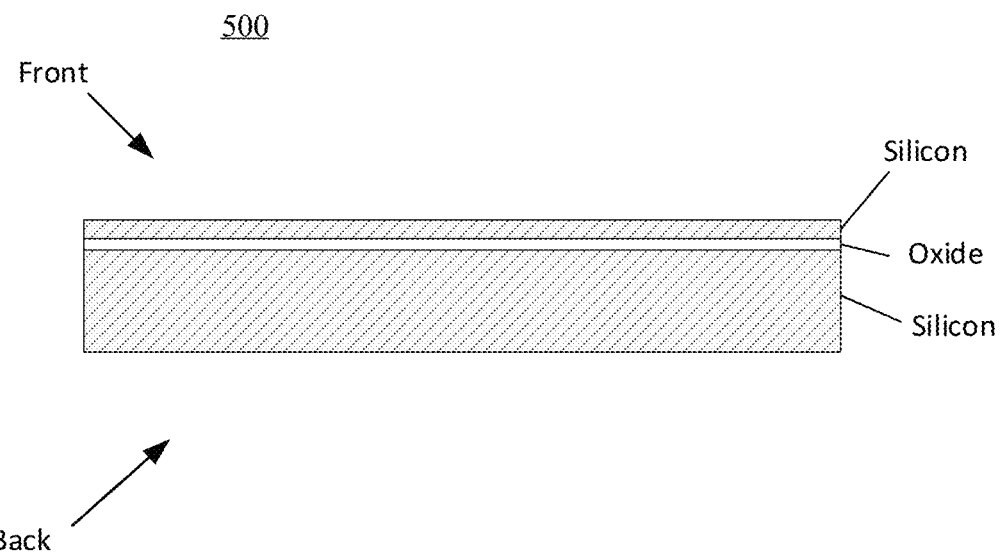
FIGS. 5A-5M illustrate a process flow for fabrication of a piezoelectric sensor with backside electrical contacts according to an example implementation.
Figure 5B:
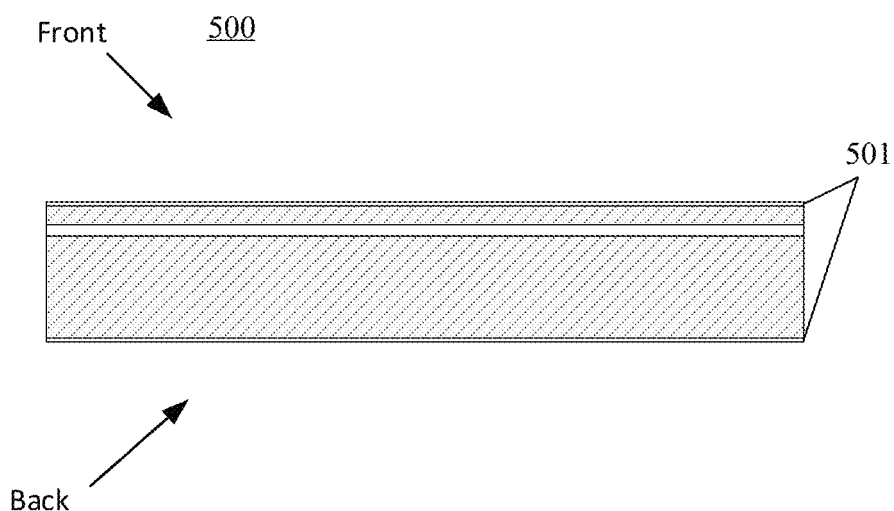
Figure 5C:
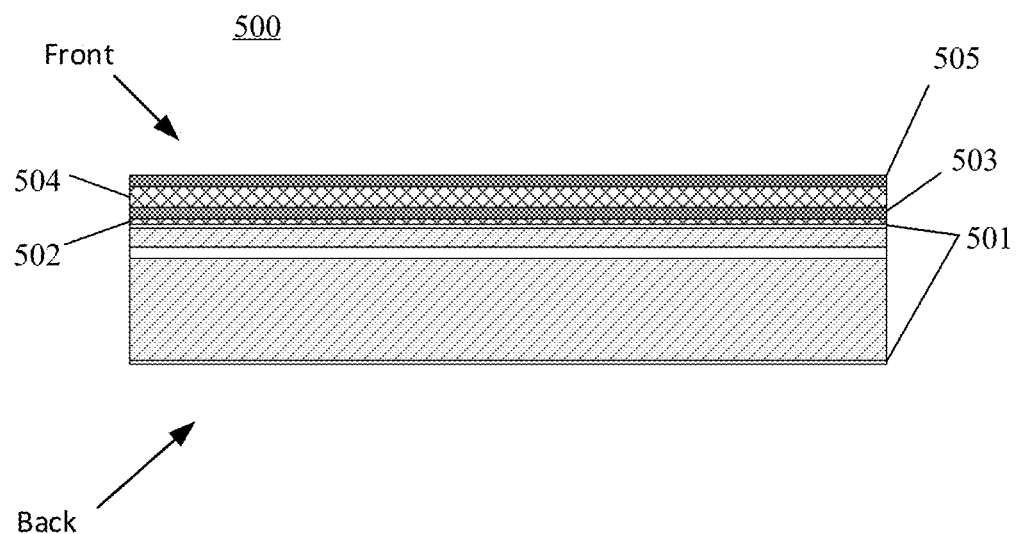

FIGS. 5A-5M illustrate a process flow for fabrication of a piezoelectric sensor with backside electrical contacts according to an example implementation. Similar to the process described with respect to FIGS. 4A-4F, in the process described with respect to FIGS. 5A-5M, the process flow can begin with a SOI wafer 500, as shown in FIG. 5A. For the piezoelectric sensor, instead of the process described with respect to FIG. 4B, processes are performed to create the piezoelectric sensing element (see e.g., FIGS. 5B-5J). For example, referring to FIG. 5B, a thermal oxide 501 is deposited onto the top and bottom of the SOI wafer 500. A piezoelectric stack can then be deposited onto the thermal oxide layer 501 on the front side of the wafer 500 to form the device layer as shown in FIG. 5C. In one example implementation, the piezoelectric stack includes, from bottom to top, a first AlN seed layer 502 of about 30 nm on the thermal oxide layer 501, a molybdenum (Mo) layer 503 of about 100 nm, a second AlN layer 504 of about 1000 nm, and a top Mo layer 505 of about 100 nm.

Figure 5D:
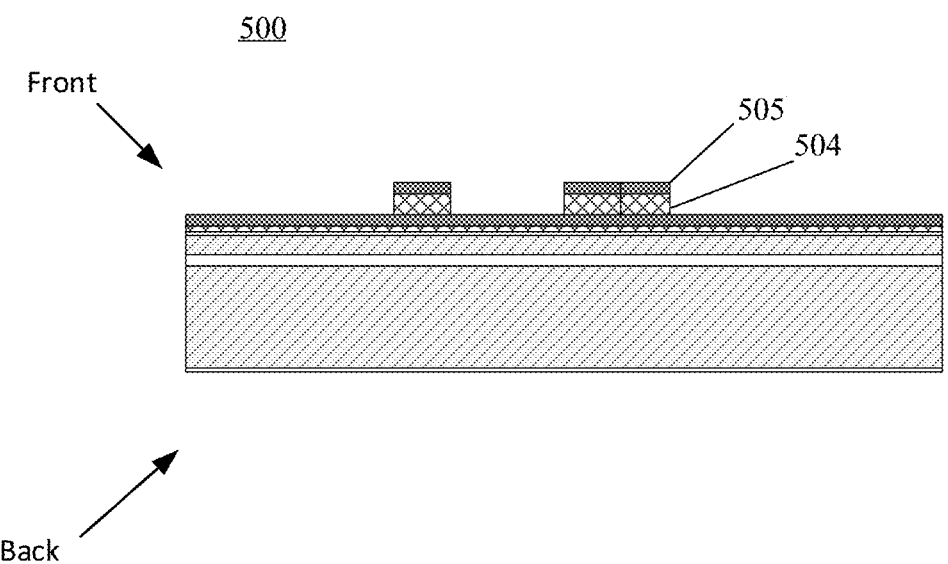
Figure 5E:
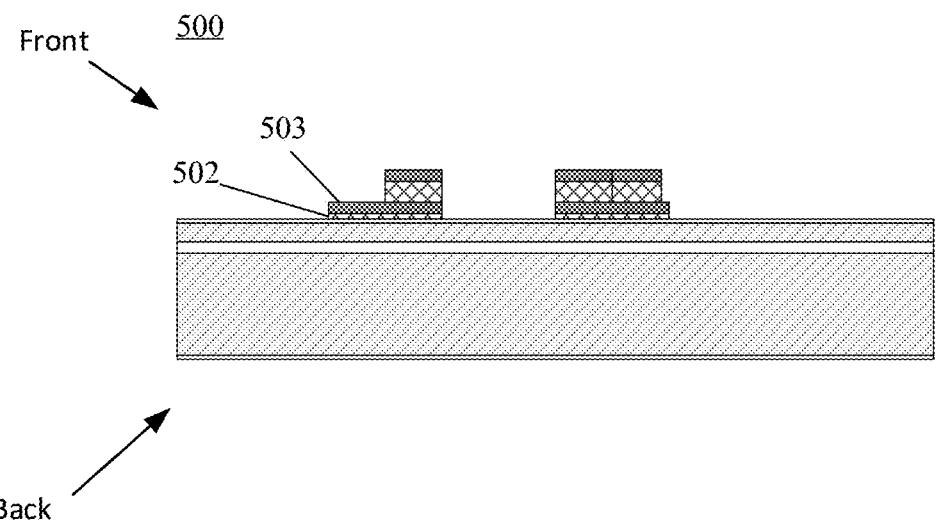

Next, referring to FIG. 5D, the top Mo layer 505 and the second AlN layer 504 can be etched, for example using a photoresist mask (not shown). In addition, referring to FIG. 5E, the bottom Mo layer 503 and the first AlN seed layer 502 can be etched, for example using a photoresist mask (not shown).

Figure 5F:
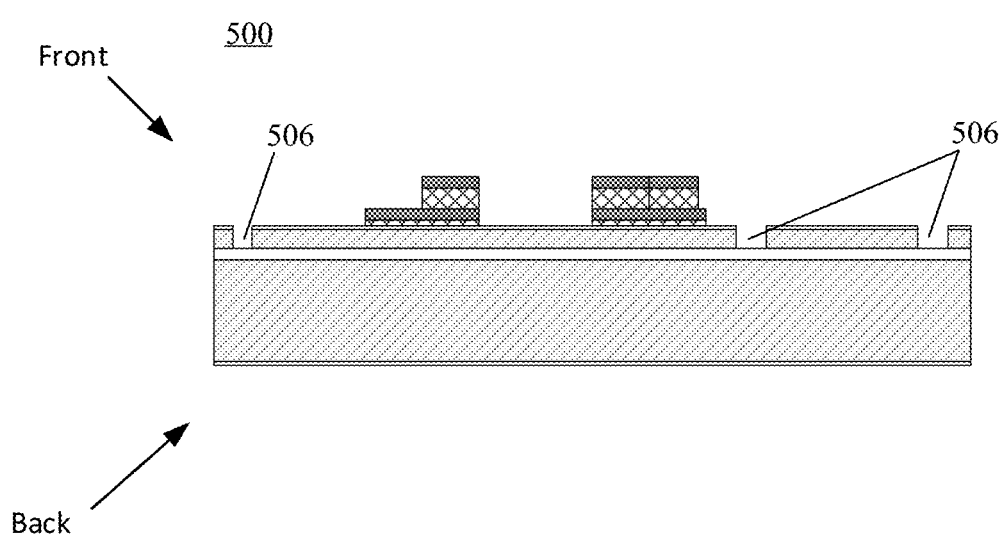
Figure 5G:
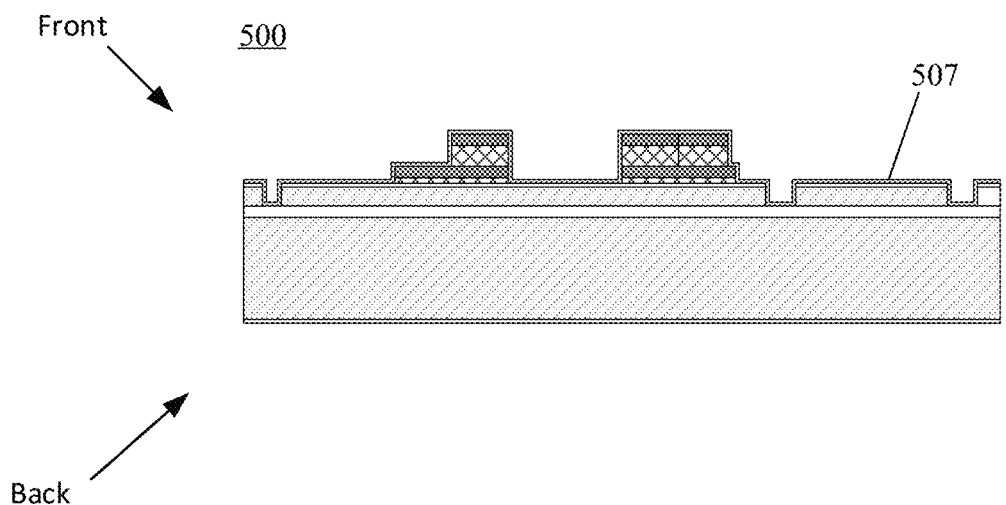
Figure 5H:
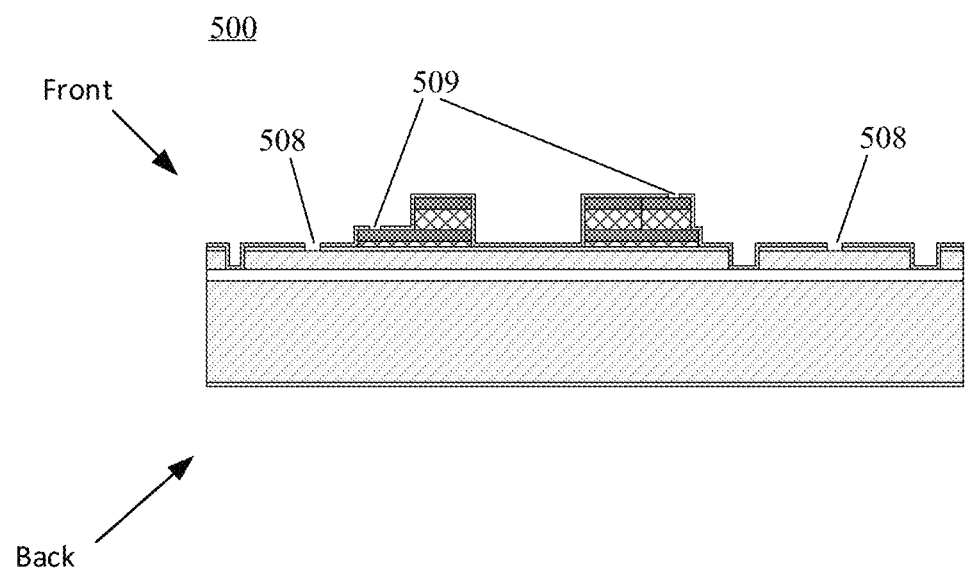
Figure 5I:
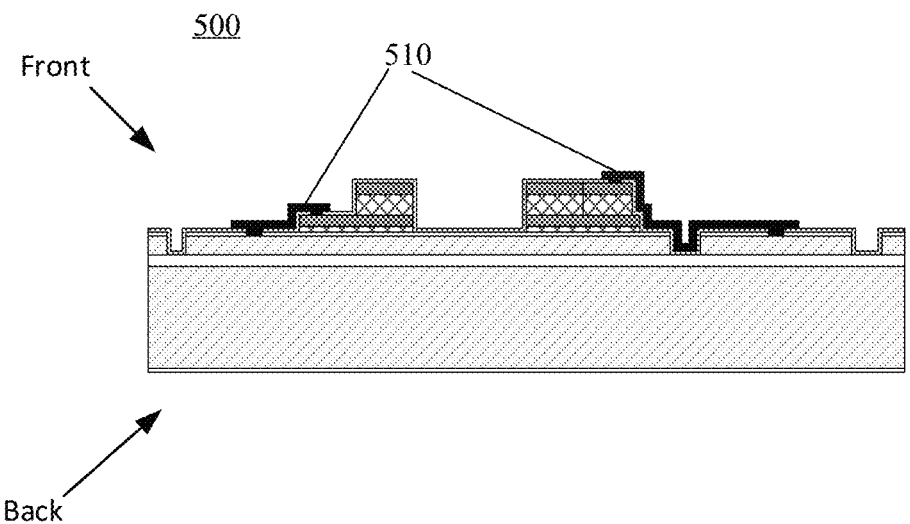
Figure 5J:
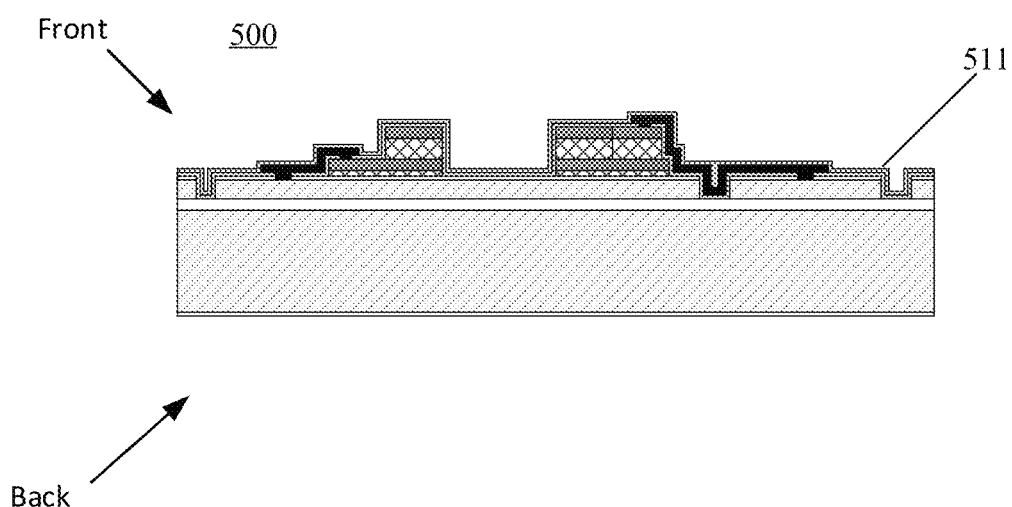

Referring to FIG. 5F, the front of the wafer 500 can be etched, for example using a photoresist mask (not shown), to expose the buried oxide layer in the SOI wafer 500 through openings 506. Referring to FIG. 5G, a silicon nitride (SiN) layer 507 can be deposited onto the structure and in the openings 506, for example, by plasma enhanced chemical vapor deposition (PECVD); and device ground openings 508 and piezoelectric contact openings 509 can be etched through the SiN layer and thermal oxide 501 at appropriate locations as shown in FIG. 5H. Metal, such as metal aluminum-2% silicon (Al-2% Si), can be deposited and etched to form metal traces 510 over the device ground openings 508 and piezoelectric contact openings 509 as shown in FIG. 5H. Referring to FIG. 5J, a layer of SiN 511 can be deposited onto the front of wafer 500, for example to protect the piezoelectric and device layer during subsequent steps.

Figure 5K:
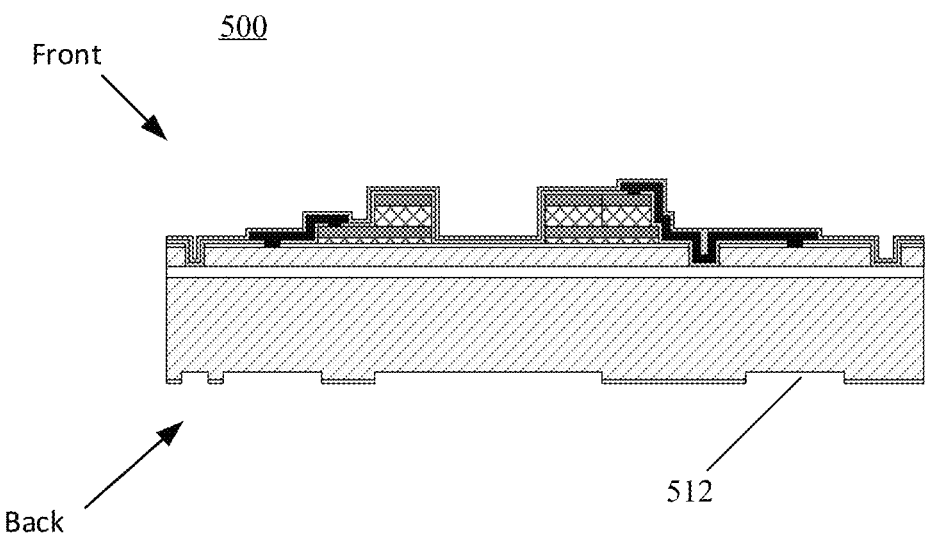
Figure 5L:
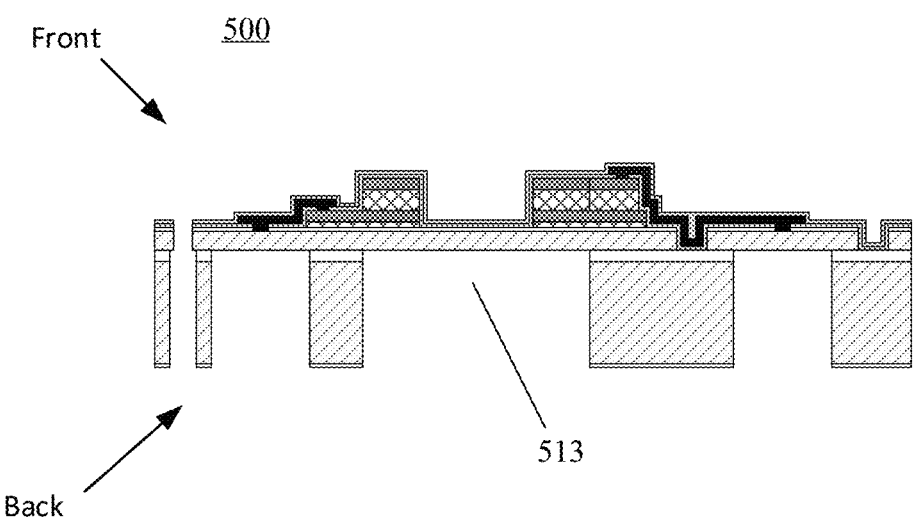

Referring to FIGS. 5K and 5L, the backside thermal oxide can be removed to form backside vents 512; and a backside bulk micromachining process (e.g., DRIE, wet chemical etching, plasma etching, or laser machining) can be performed to form the backside cavities 513. In some cases, the backside process may be carried out in a similar process as that described with respect to FIGS. 4D and 4E.

Figure 5M:
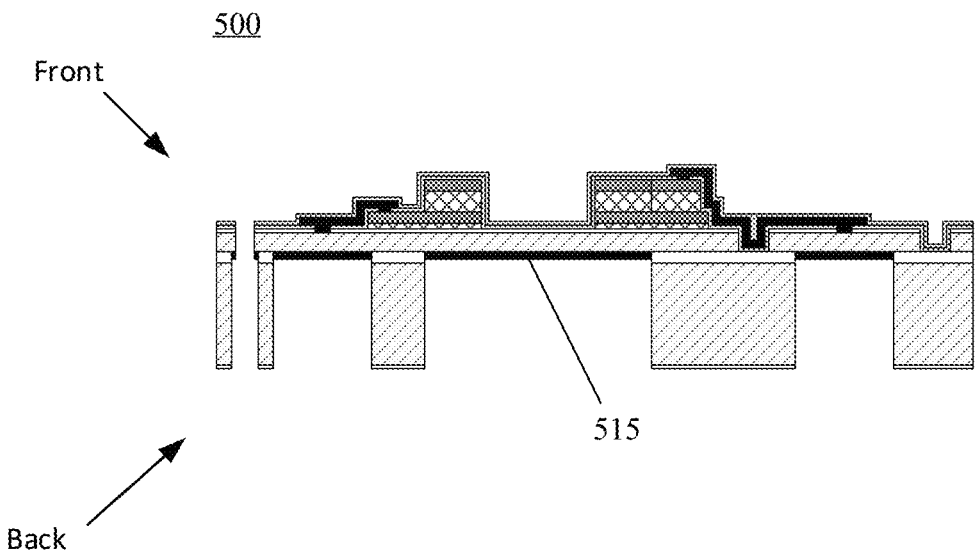

Referring to FIG. 5M, wire bondable metal 515 can be deposited onto the backside of the wafer 500 in the cavities 513. The wire bondable metal 515 can be, for example, metal aluminum-2% silicon (Al-2% Si), aluminum, gold, another wire bondable metal, or a combination thereof. After bonding the backside of the fabricated wafer to a circuit board, wire bonds can be formed. As can be seen from the described fabrication process of FIGS. 5A-5M, the silicon device layer of the SOI substrate is used for the electrodes instead of trying to isolate the silicon device layer. Instead, the bottom electrode and a majority of the device layer can be held at ground and the top electrode is attached to an island in the device layer that is isolated from the rest of the device layer (see FIG. 5L). Several benefits of this process include the elimination of a timed BOX etch to create contact between the back and frontside metal and the elimination of a hole in the middle of the wire bond area, resulting in less likelihood of damage to the silicon device layer during wire bonding.

Figure 6:
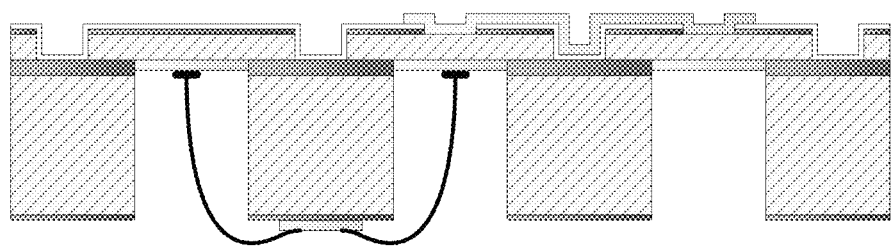
FIG. 6 illustrates an example sensor structure that includes front side circuitry.

FIG. 6 illustrates an example sensor structure that includes front side circuitry. The sensor with backside electrical contacts as shown in FIG. 6 can be fabricated as described with respect to FIGS. 4A-4F, and include additional deposition and etching steps for the front side traces.

Example Sensor

A hydraulically smooth wall shear stress sensor in the form of the sensor of FIG. 7 for low-speed wind tunnel applications was fabricated in accordance with the above techniques.

Figure 8:
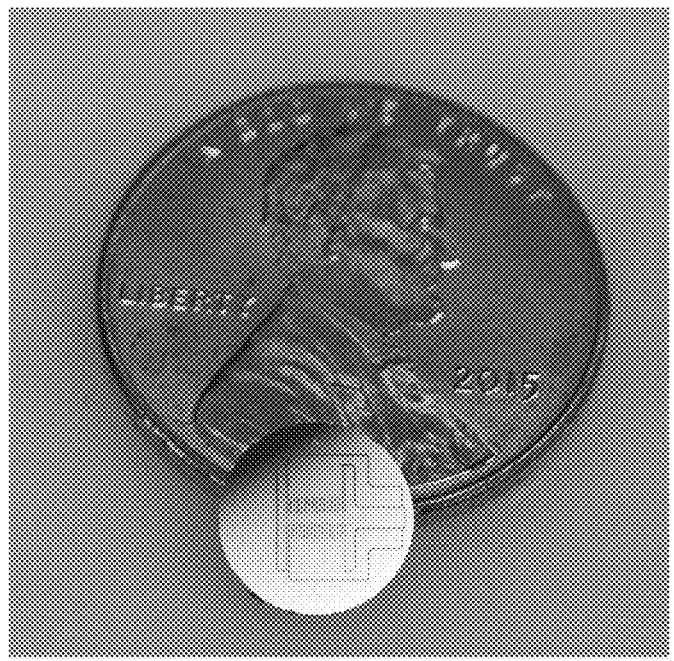
FIG. 8 shows an image of a fabricated shear stress sensor die based on the example differential capacitive wall shear stress sensor of FIG. 7.

An image of the fabricated sensor die is shown in FIG. 8. The modular package includes a sensor end cap, amplifier housing, and detachable shielded cable. A 7-mm diameter circular die footprint is chosen to provide flexibility in sensor design as well as to eliminate the shim caps which have previously been used to create a flush package surface.

Figure 9:
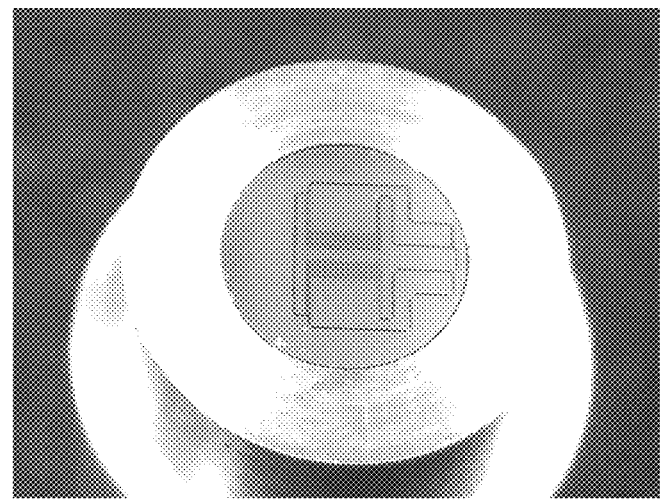
FIG. 9 shows an image of the packaged shear stress sensor of FIG. 8.

The primary dimensions of the sensor head are 15.9 mm diameter and 52.3 mm length. The sensing end of the head is 12.7 mm diameter, with a 6.4 mm shoulder to provide an accurate, repeatable installation depth. The main body of the sensor head also contains a 2-mm keyway for proper alignment with the flow direction. The amplifier housing is a hollow tube of stainless steel which houses the amp board that contains the AD8022 buffer amplifier, filtering capacitors, and a bias resistor to provide a path for dissipation of dc charge. A six-pin LEMO receptacle is pressed into the back end of the housing, providing interchangeable cable lengths for various testing configurations. The complete packaged sensor is shown in FIG. 9. The opposite end of the sensor cable connects to a sensor control unit (SCU) which contains power conditioning electronics, rechargeable lithium-ion batteries, and a synchronous modulation/demodulation (SMOD/DMOD) circuit that enables measurement of mean shear stress.

Figure 10A:
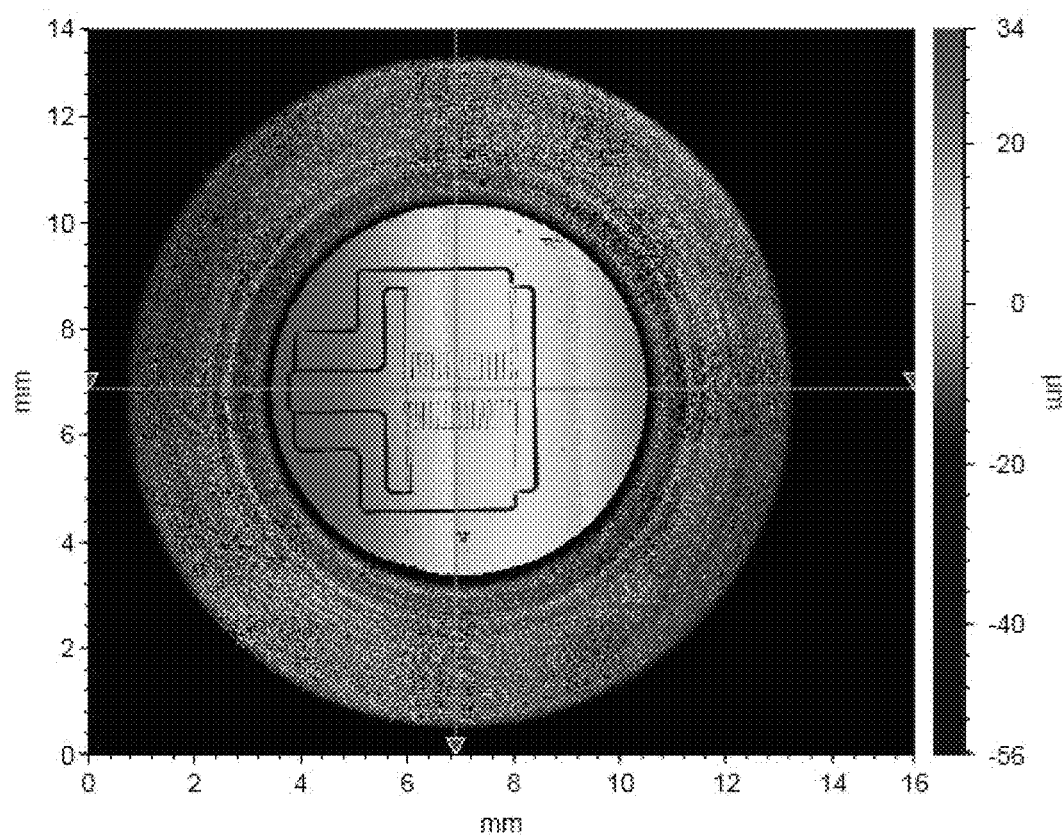
FIGS. 10A and 10B illustrate the scanning white light interferometry (SWLI) measurements of the packaged sensor.
Figure 10B:
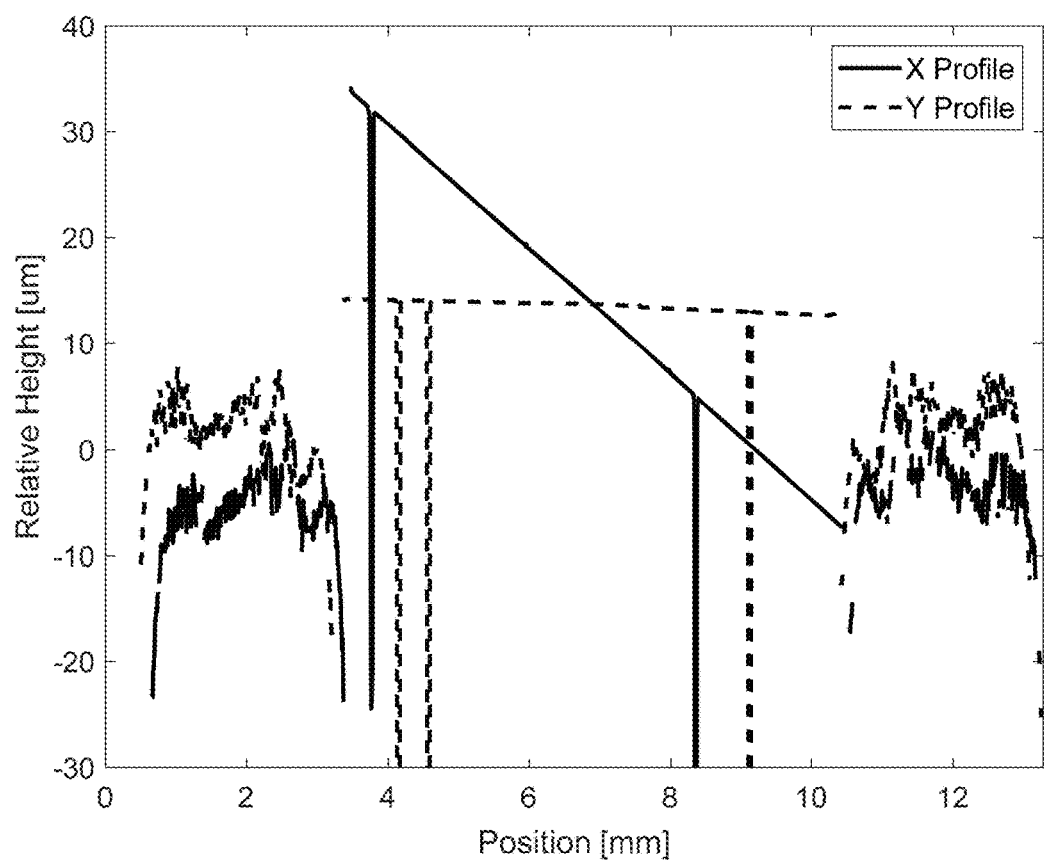
Figure 11A:
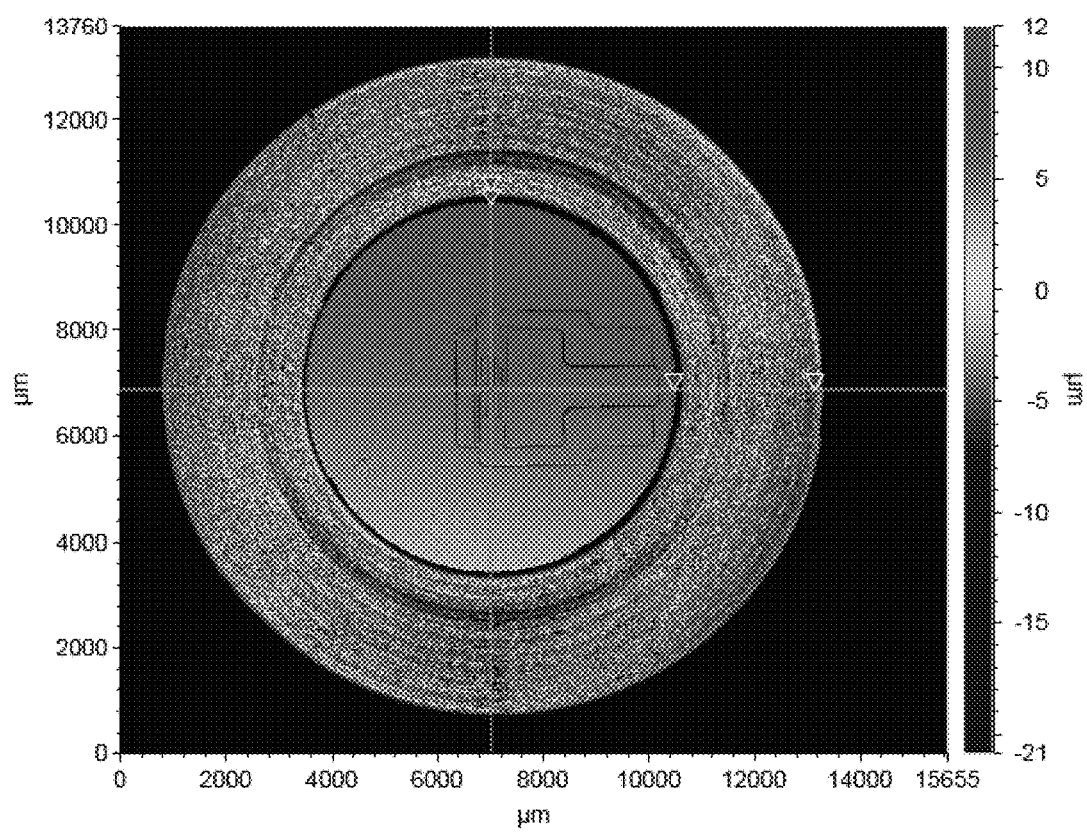
FIGS. 11A and 11B illustrate SWLI measurements of another packaged sensor.
Figure 11B:
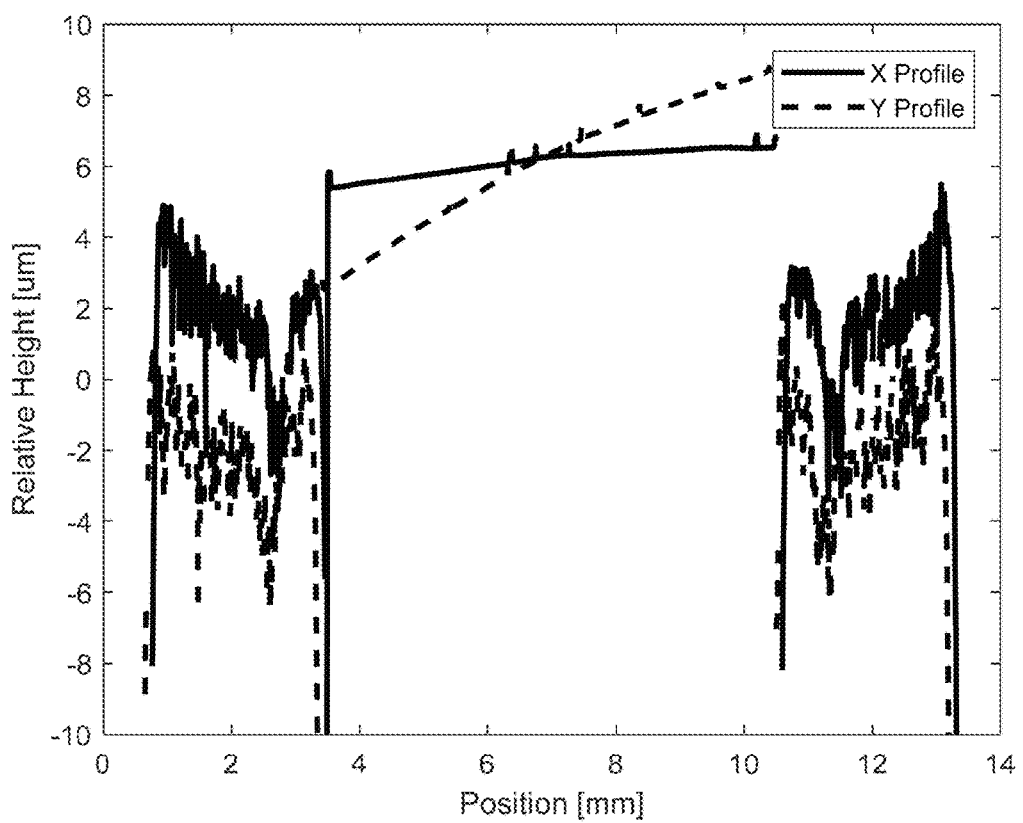

Scanning white light interferometry (SWLI) measurements of prototypes of the packaged sensor, shown in FIGS. 10A and 11A, and the associated X and Y profiles, shown in FIGS. 10B and 11B, indicate a hydraulically smooth front surface for low-speed flows. In FIGS. 10A and 10B, the maximum step of roughly 40 µm occurs on the downstream side of the sensor at the junction between the sensor die and stainless-steel cap. Overall roughness is below 5 µm with the majority of this roughness found on the face of the metal housing. As can be seen from FIG. 10B, it is possible to provide a suitable flush front side surface with the specific device tested. In FIGS. 11A and 11B, the maximum step height is reduced to 8-9 µm and occurs at the top edge of the sensor die, while the maximum step in the sensing (X Profile) direction is less than 5 µm at the leading and trailing edges of the sensor die.

Although the subject matter has been described in language specific to structural features and/or processes, it is to be understood that the subject matter defined in the appended claims is not necessarily limited to the specific features or processes described above. Rather, the specific features and processes described above are disclosed as examples of implementing the claims and other equivalent features and processes are intended to be within the scope of the claims.

What is claimed is:

1. A microscale sensor comprising: a device layer having a front side and a back side, the front side of the device layer being positioned for exposure to a passing fluid; a support substrate at the back side of the device layer, the support substrate having contact openings for accessing a conductive backside surface at the back side of the device layer, wherein electrical connection to the device layer is not formed with a through-wafer via; and wherein the microscale sensor is configured to be flush mounted.

2. The microscale sensor of claim 1, further comprising: an electrical circuit board on which the support substrate is attached.

3. The microscale sensor of claim 2, wherein the electric al circuit board comprises one or more openings exposing the contact openings of the support substrate from a back side of the electric al circuit board.

4. The microscale sensor of claim 3, wherein the electrical connection to the device layer attaches at one end to the back side of the device layer and attaches at the other end to the back side of the electrical circuit board, passing through one of the one or more openings of the electrical circuit board.

5. The microscale sensor of claim 2, wherein the electrical circuit board comprises a printed circuit board.

6. The microscale sensor of claim 2, wherein the electrical circuit board comprises an interposer.

7. The microscale sensor of claim 1, further comprising: a sensor electrode on the front side of the device layer; and one or more conductive vias within the device layer extending from the sensor electrode to the back side of the device layer for the electrical connection at the back side of the device layer.

8. The sensor of claim 1, wherein a capacitive shear stress sensor is formed in the device layer.

9. The sensor of claim 1, wherein the device layer comprises a piezoelectric material.

10. The microscale sensor of claim 1, wherein the support substrate is an insulating support substrate.

11. The microscale sensor of claim 10, wherein the insulating support substrate comprises glass.

12. The microscale sensor of claim 10, wherein the insulating support substrate comprises sapphire.

13. The microscale sensor of claim 1, further comprising an isolation layer between the support substrate and the device layer.

14. The microscale sensor of claim 13, wherein the isolation layer comprises silicon dioxide.

15. The microscale sensor of claim 13, wherein the isolation layer comprises silicon nitride.

16. The microscale sensor of claim 13, wherein the device layer and the support substrate are formed from a silicon-on-insulator (SOI) wafer, the isolation layer being formed of a buried oxide layer of the SOI wafer.

17. The microscale sensor of claim 1, wherein the electrical connection to the device layer comprises a wire bond.

18. The microscale sensor of claim 17, wherein the wire bond comprises gold, aluminum, silver, copper, or a combination thereof.

19. The microscale sensor of claim 1, wherein the electric al connection to the device layer comprises a conductive adhesive.

* * * * *